(12) United States Patent
Izumi

(10) Patent No.: US 6,275,330 B1
(45) Date of Patent: Aug. 14, 2001

(54) APPARATUS AND METHOD FOR CONTROLLING A WAVELENGTH-MULTIPLEX OPTICAL AMPLIFIER

(75) Inventor: Futoshi Izumi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/413,029

(22) Filed: Oct. 6, 1999

(30) Foreign Application Priority Data

Feb. 17, 1999 (JP) .................................................. 11-039103

(51) Int. Cl.[7] .................................................. H01S 3/00
(52) U.S. Cl. ..................................... 359/341.42; 359/177
(58) Field of Search .................................. 359/341, 177, 359/341.42

(56) References Cited

U.S. PATENT DOCUMENTS 5,680,246 * 10/1997 Takahashi et al. ............... 359/341
5,838,488 * 11/1998 Kobayashi ........................ 359/341
5,909,305 * 6/1999 Kinoshita ......................... 359/341

FOREIGN PATENT DOCUMENTS 9-289503   11/1997 (JP) .

* cited by examiner

Primary Examiner—Mark Hellner
(74) Attorney, Agent, or Firm—Staas & Halsey LLP

(57) ABSTRACT

In an wavelength-multiplex optical amplifier control apparatus and method which executes an automatic level control on an optical amplifier to maintain an output optical power of the amplifier at a constant level, first and second power levels are photoelectrically detected from an input optical signal carrying wavelength-division multiplexed data, by using first and second quantization characteristics. Based on the detected first and second power levels, it is detected whether an optical power of at least one channel in the multiplexed data is partly turned off or partly changes. The execution of the automatic level control is inhibited when it is detected that the optical power of at least one channel in the multiplexed data is partly turned off or partly changes.

16 Claims, 10 Drawing Sheets

F I G. 3A    F I G. 3B
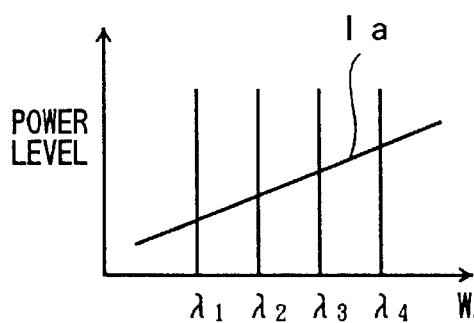
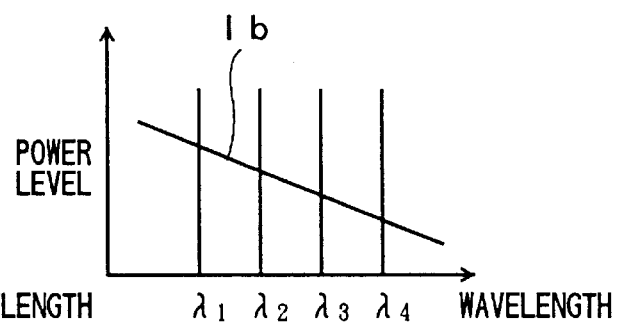

F I G. 1 1
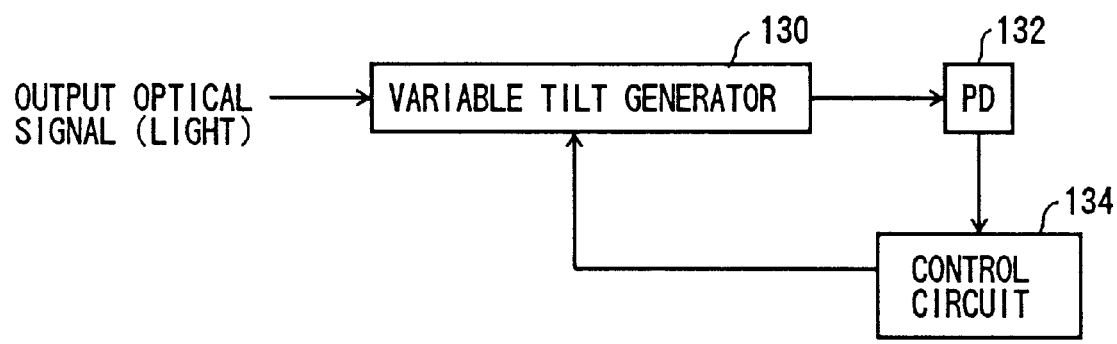

APPARATUS AND METHOD FOR CONTROLLING A WAVELENGTH-MULTIPLEX OPTICAL AMPLIFIER

BACKGROUND OF THE INVENTION (1) Field of the Invention

The present invention relates to an apparatus and method which controls a wavelength-multiplex optical amplifier by executing an automatic level control, so that the output optical power is maintained at a constant level.

(2) Description of the Related Art

In a wavelength-multiplex optical amplifier control apparatus which utilizes wavelength-division multiplexing (WDM), an automatic level control (ALC) is executed by varying a gain of an optical amplifier so as to maintain the output optical power at a constant level. The execution of the ALC on the optical amplifier, which maintains the output optical power at the constant level even when the input optical power changes, makes it possible to avoid the occurrence of an error of the multiplexed data at a downstream node due to fluctuation of the optical signal power. In addition, if the ALC is performed, the output optical power can be maintained at the constant level even when the input optical power considerably changes due to different transmission losses at different transmission distances of trunk nodes in an optical fiber transmission system.

Generally, when the ALC is executed during the wavelength-multiplex amplifier control, it is necessary that the output optical power of each of the individual channels, contained in the optical signal output by the optical amplifier, be monitored in order to appropriately adjust the power gain and maintain the output optical power at the constant level. However, as the number of channels in the multiplexed data increases, the hardware having an increasingly large size is needed to monitor the output optical power for each individual channel, and it will become expensive.

FIG. 1 shows a conventional wavelength-multiplex optical amplifier control apparatus.

In the conventional wavelength-multiplex optical amplifier control apparatus of FIG. 1, an input optical signal carrying the wavelength-division multiplexed data is supplied to an optical amplifier 10. An automatic level control (ALC) circuit 12 outputs a control signal to the optical amplifier 10 by executing the ALC. The optical amplifier 10 amplifies the input optical signal by varying the gain according to the received control signal, and outputs the amplified optical signal to an optical splitter 14.

Alternatively, the optical amplifier 10 may include a variable attenuator, and the ALC circuit 12 may output a control signal to the variable attenuator. The amount of attenuation of the input optical signal at the variable attenuator is varied according to the control signal output by the ALC circuit 12. The optical amplifier 10 amplifies the input optical signal by a given gain, and the amplified optical signal is processed through the variable attenuator. The optical amplifier 10 supplies the output of the variable attenuator to the optical splitter 14 so that the output optical power is maintained at the constant level.

In the conventional wavelength-multiplex optical amplifier control apparatus of FIG. 1, the ALC circuit 12 outputs a control signal to the optical amplifier 10 so that the output optical power is maintained at a constant level according to the control signal. However, if an optical power of a certain channel in the multiplexed data is partly turned off or partly changes at an upstream node, the output optical power at the output of the optical amplifier 10 is maintained at the same constant level without taking account of the off-state or change of the channel. An error of the remaining channels in the multiplexed data will occur at a downstream node due to the fluctuation of the optical signal power.

In order to avoid the occurrence of such an error, it is necessary to transmit a monitoring control signal, indicating the off-state or change of one channel in the multiplexed data, to the optical amplifier 10 of the control apparatus of FIG. 1 as well as to the optical amplifiers of the downstream nodes, in addition to the transmission of the multiplexed data stream. By receiving the monitoring control signal at the conventional wavelength-multiplex optical amplifier control apparatus of FIG. 1, the ALC circuit 12 outputs a corrected control signal to the optical amplifier 10 according to the monitoring control signal, such that the output optical power is maintained at a suitably corrected level according to the control signal. This makes it possible to avoid the occurrence of an error of the remaining channels at the downstream node.

However, in a case in which the transmission of the monitoring control signal is used, if the monitoring control signal is erroneously not transmitted (or erroneously set in an off-state) and an optical power of a primary channel in the multiplexed data is turned off or changes, an error of the remaining channels in the multiplexed data may occur at a downstream node, because the ALC is executed at the control apparatus of FIG. 1 without taking account of the off-state or change of the primary channel.

Further, in the case in which the transmission of the monitoring control signal is used, the downstream nodes have the delay in receiving the monitoring control signal while the monitoring control signal is terminated at each node. It is necessary that the execution of the ALC by the control apparatus of FIG. 1 is started at an adequately delayed timing. If the number of remote nodes in the optical transmission system increases, the delay in receiving the monitoring control signal at the remote nodes becomes increasingly large. Hence, the start of the execution of the ALC at the final node may be considerably delayed until the monitoring control signal is received by the final node.

Accordingly, in a case in which a speedy execution of the ALC at the downstream nodes and a fail-safe function of the optical transmission system are desired, the transmission of the monitoring control signal is not used, and a spectrum analyzer is needed for the conventional wavelength-multiplex optical amplifier control apparatus at each node. The spectrum analyzer acts to monitor the output optical power of each of the individual channels, contained in the output signal of the optical amplifier, in order to adjust the power gain and maintain the output optical power at the constant level. However, the implementation of a spectrum analyzer into each of the nodes of the optical transmission system will be considerably expensive.

SUMMARY OF THE INVENTION

An object of the present invention is to provide an improved wavelength-multiplex optical amplifier control in which the above-mentioned problems are eliminated.

Another object of the present invention is to provide a wavelength-multiplex optical amplifier control apparatus which safely inhibits the execution of the automatic level control when an optical power of a certain channel in the multiplexed data is partly turned off or partly changes, by using a simple, cost-effective circuit configuration with no need for a spectrum analyzer.

Still another object of the present invention is to provide a wavelength-multiplex optical amplifier control method which safely inhibits the execution of the automatic level control when an optical power of a certain channel in the multiplexed data is partly turned off or partly changes, in a simple, cost-effective manner that does not require a spectrum analyzer.

The above-mentioned objects of the present invention are achieved by a wavelength-multiplex optical amplifier control apparatus in which an automatic level control is executed on an optical amplifier to maintain an output optical power of the amplifier at a constant level, the apparatus including: first and second photodetecting units, having different quantization characteristics, which respectively detect first and second power levels from an input optical signal carrying wavelength-division multiplexed data; a power change detecting unit which detects whether an optical power of at least one channel in the multiplexed data is partly turned off or partly changes, based on the first and second power levels detected by the first and second photodetecting units; and an observing unit which inhibits the execution of the automatic level control when the power change detecting unit detects that the optical power of at least one channel in the multiplexed data is partly turned off or partly changes.

The above-mentioned objects of the present invention are achieved by a wavelength-multiplex optical amplifier control method which executes an automatic level control on an optical amplifier to maintain an output optical power of the amplifier at a constant level, the method including the steps of: photoelectrically detecting a first power level and a second power level from an input optical signal carrying wavelength-division multiplexed data, by using first and second photodetecting units having different quantization characteristics; detecting whether an optical power of at least one channel in the multiplexed data is partly turned off or partly changes, based on the detected first and second power levels; and inhibiting the execution of the automatic level control when it is detected that the optical power of at least one channel in the multiplexed data is partly turned off or partly changes.

In the wavelength-multiplex optical amplifier control apparatus and method of the present invention, when the power change ratio changes, it is determined that the optical power of at least one channel in the multiplexed data has been partly turned off or has partly changed. The execution of the automatic level control (ALC) is inhibited by using the power-change-ratio observation. The wavelength-multiplex optical amplifier control apparatus and method of the present invention uses a simple, cost-effective circuit configuration and is effective in avoiding the occurrence of an error of the multiplexed data due to fluctuation of the optical signal power in such a case. The use of a spectrum analyzer and the transmission of the monitoring control signal are not required. When the power change ratio remains unchanged, it is determined that all the optical powers of the channels in the multiplexed data have equally changed. The execution of the ALC is allowed by using the power-change-ratio observation. The wavelength-multiplex optical amplifier control apparatus and method of the present embodiment is effective in maintaining the output optical power at a constant level in such a case.

BRIEF DESCRIPTION OF THE DRAWINGS

The above and other objects, features and advantages of the present invention will become more apparent from the following detailed description when read in conjunction with the accompanying drawings in which:

FIG. 3A and FIG. 3B are diagrams showing examples of quantization characteristics which gain equalizers including photodiodes according to the present invention have;

FIG. 11 is a block diagram of a portion of the wavelength-multiplex optical amplifier control apparatus which detects the optical power of one channel in the multiplexed data.

DETAILED DESCRIPTION OF THE PREFERRED EMBODIMENTS

Before explaining the preferred embodiments of the present invention, a description will be given of a wavelength-multiplex optical amplifier control according to the present invention with reference to FIG. 2, in order to facilitate understanding of the principles of the present invention.

Figure 1:
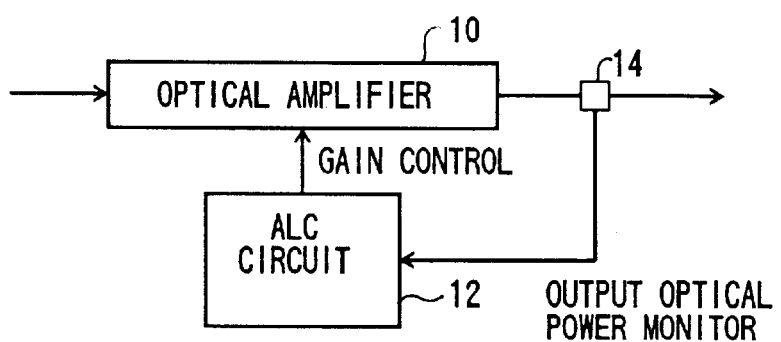
FIG. 1 is a block diagram of a conventional wavelength-multiplex optical amplifier control apparatus.
Figure 2:
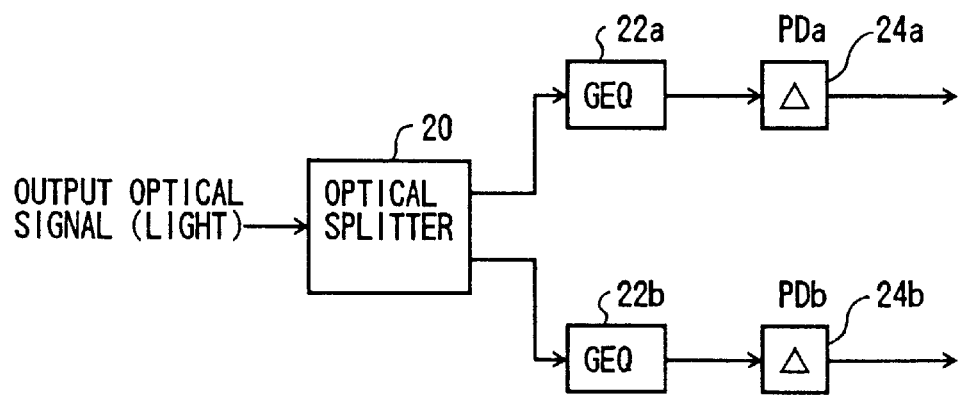
FIG. 2 is a diagram for explaining the principles of the present invention.

FIG. 2 is a diagram for explaining the principles of the present invention.

As shown in FIG. 2, an optical signal carrying the wavelength-division multiplexed data, output by an optical amplifier (not shown), is supplied to an optical splitter 20. The optical splitter 20 separates the received optical signal into two light beams, and delivers the light beams to a gain equalizer (GEQ) 22a and a gain equalizer (GEQ) 22b. The gain equalizers 22a and 22b are constituted by optical filters having a predetermined wavelength characteristic.

The light beam output by the gain equalizer 22a is photoelectrically converted at a photodiode (PD) 24a so that the photodiode 24a outputs a first multiplexed signal depending on a first wavelength-dependent quantization characteristic. According to the first wavelength-dependent quantization characteristic, the receiving power level of one channel in the first multiplexed signal increases as the wavelength increases. The light beam output by the gain equalizer 22b is photoelectrically converted at a photodiode (PD) 24b so that the photodiode 24b outputs a second multiplexed signal depending on a second wavelength-dependent quantization characteristic. Conversely to the first wavelength-dependent quantization characteristic, according to the second wavelength-dependent quantization characteristic, the receiving power level of one channel in the second multiplexed signal decreases as the wavelength increases.

Suppose that the signal elements for the individual wavelengths (the first through fourth wavelengths) contained in the optical signal received at the optical splitter 20 have equal receiving power. A receiving power level Pa detected at the photodiode 24a and a receiving power level Pb detected at the photodiode 24b are represented by the following equations:

$$Pa=\eta a(\lambda 1)P+\eta a(\lambda 2)P+\eta a(\lambda 3)P+\eta a(\lambda 4)P \quad (1)$$

$$Pb=\eta b(\lambda 1)P+\eta b(\lambda 2)P+\eta b(\lambda 3)P+\eta b(\lambda 4)P \quad (2)$$

where the conditions $\eta a (\lambda k) \neq \eta b (\lambda k)$ (k=1, 2, 3, 4) are satisfied.

In a wavelength-multiplex optical amplifier control apparatus of the present invention, the gain equalizers 22a and 22b including the photodiodes 24a and 24b are configured so that the first multiplexed signal output by the photodiode 24a relies on the first wavelength-dependent quantization characteristic, and the second multiplexed signal output by the photodiode 24b relies on the second wavelength-dependent quantization characteristic.

FIG. 3A and FIG. 3B show examples of the different quantization characteristics which the gain equalizers 22a and 22b including the photodiodes 24a and 24b according to the present invention have. The first wavelength-dependent quantization characteristic of the gain equalizer 22a including the photodiode 24a is indicated by the solid line "Ia" in FIG. 3A, and the second wavelength-dependent quantization characteristic of the gain equalizer 22b including the photodiode 24b is indicated by the solid line "Ib" in FIG. 3B.

When the optical power of one channel (the first wavelength λ1) in the multiplexed data partly changes by δP, the receiving power level Pa' detected at the photodiode 24a and the receiving power level Pb' detected at the photodiode 24b, in such a case, are represented by the following equations:

$$Pa'=\eta a(\lambda 1)(P+\delta P)+\eta a(\lambda 2)P+\eta a(\lambda 3)P+\eta a(\lambda 4)P=Pa+\eta a(\lambda 1)P$$

$$Pb'=\eta b(\lambda 1)(P+\delta P)+\eta b(\lambda 2)\ P+\eta b(\lambda 3)P+\eta b(\lambda 4)P=Pb+\eta b(\lambda 1)\delta P$$

As the condition $\eta a (\lambda 1) \neq \eta b(\lambda 1)$ is satisfied, the ratio of the change (Pa–Pa') in the receiving power level of the photodiode 24a to the change (Pb–Pb') in the receiving power level of the photodiode 24b changes in the above case. According to the principles of the present invention, when the optical power of at least one channel in the multiplexed data partly changes, the power change ratio (Pa–Pa')/(Pb–Pb') always changes.

When the optical power of one channel (the fourth wavelength λ4) in the multiplexed data is partly turned off, the receiving power level Pa' detected at the photodiode 24a and the receiving power level Pb' detected at the photodiode 24b, in such a case, are represented by the following equations:

$$Pa'=\eta a(\lambda 1)P+\eta a(\lambda 2)P+\eta a(\lambda 3)P$$

$$Pb'=\eta b(\lambda 1)P+\eta b(\lambda 2)P+\eta b(\lambda 3)P$$

As the condition $\eta a(\lambda 4)P \neq \eta b(\lambda 4)\ P$ is satisfied, the ratio of the change (Pa–Pa') in the receiving power level of the photodiode 24a to the change (Pb–Pb') in the receiving power level of the photodiode 24b changes in the above case. According to the principles of the present invention, when the optical power of at least one channel in the multiplexed data is partly turned off, the power change ratio (Pa–Pa')/(Pb–Pb') always changes.

On the other hand, when all the optical powers of the individual channels in the multiplexed data equally change from P to P', the receiving power level Pa' detected at the photodiode 24a and the receiving power level Pb' detected at the photodiode 24b, in such a case, are represented by the following equations:

$$Pa'=\eta a(\lambda 1)P'+\eta a(\lambda 2)P'+\eta a(\lambda 3)P'+\eta a(\lambda 4)P'$$

$$Pb'=\eta b(\lambda 1)P'+\eta b(\lambda 2)P'+\eta b(\lambda 3)P'+\eta b(\lambda 4)P$$

In the above case, the ratio of the change (Pa–Pa') in the receiving power level of the photodiode 24a to the change (Pb–Pb') in the receiving power level of the photodiode 24b remains unchanged. According to the principles of the present invention, when all the optical powers of the individual channels in the multiplexed data equally change, the power change ratio (Pa–Pa')/(Pb–Pb') remains unchanged.

The wavelength-multiplex optical amplifier control of the present invention makes use of the first and second multiplexed signals output by the photodiodes 24a and 24b, to determine whether or not the power change ratio (Pa–Pa')/(Pb–Pb') changes. When the power change ratio changes, it is determined that, since the optical power of at least one channel in the multiplexed data has been partly turned off or has partly changed, the execution of the automatic level control (ALC) should be inhibited in order to avoid the occurrence of an error of the multiplexed data due to fluctuation of the optical signal power. On the other hand, when the power change ratio remains unchanged, it is determined that the execution of the automatic level control should be allowed in order to maintain the output optical power at a constant level.

A description will now be given of the preferred embodiments of the present invention with reference to the accompanying drawings.

Figure 4:
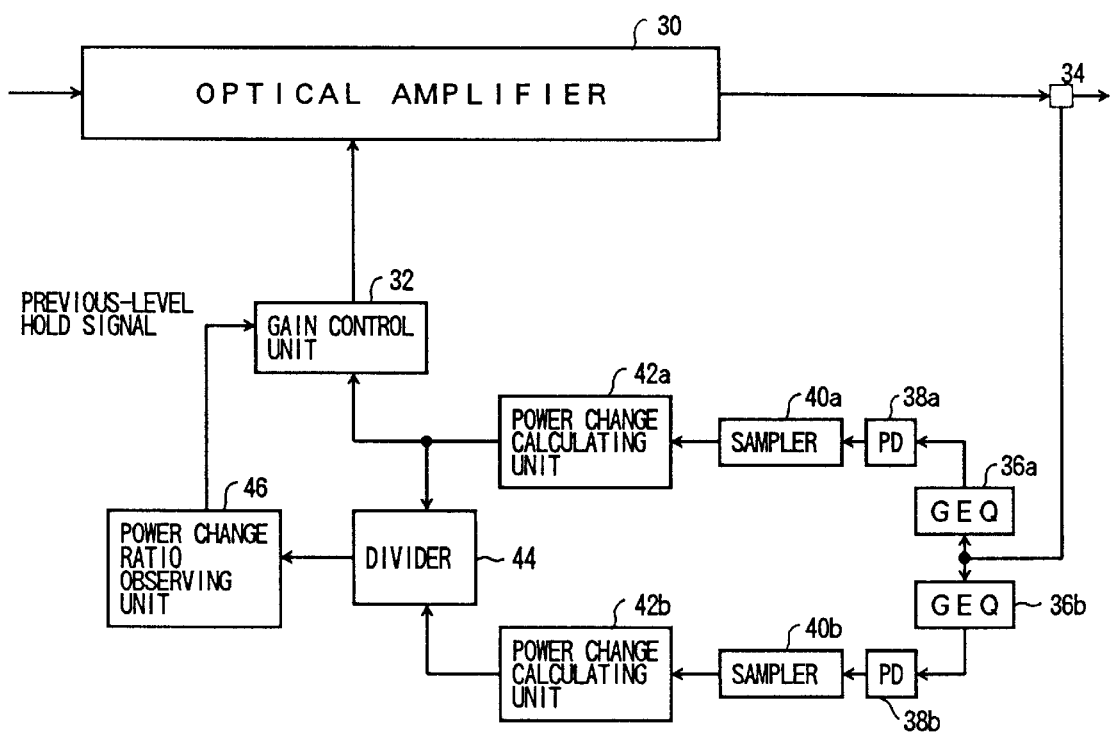
FIG. 4 is a block diagram of a first embodiment of a wavelength-multiplex optical amplifier control apparatus of the present invention.

FIG. 4 shows a first embodiment of a wavelength-multiplex optical amplifier control apparatus of the present invention.

In the wavelength-multiplex optical amplifier control apparatus of FIG. 4, an input optical signal carrying the wavelength-division multiplexed data is supplied to an optical amplifier 30. A gain control unit 32 outputs a control signal to the optical amplifier 30 by executing the automatic level control (ALC). The optical amplifier 30 amplifies the input optical signal by varying the gain according to the received control signal, and outputs the amplified optical signal to an optical splitter 34. The output optical power of the optical amplifier 30 is maintained at a constant level through the ALC.

Alternatively, the optical amplifier 30 may include a variable attenuator, and the gain control unit 32 may output a control signal to the variable attenuator. The amount of attenuation of the input optical signal at the variable attenuator is varied according to the control signal. The optical amplifier 30 amplifies the input optical signal by a given gain, and the amplified optical signal is processed through the variable attenuator. The optical amplifier 30 supplies the output of the variable attenuator to the optical splitter 34 so that the output optical power is maintained at the constant level.

In the wavelength-multiplex optical amplifier control apparatus of FIG. 4, the optical splitter 34 separates the optical signal, output by the optical amplifier 30, into two light beams, and delivers the light beams to a gain equalizer (GEQ) 36a and a gain equalizer (GEQ) 36b. The light beam output by the gain equalizer 36a is photoelectrically converted at a photodiode (PD) 38a so that the photodiode 38a outputs a first multiplexed signal depending on the first wavelength-dependent quantization characteristic indicated by "Ia" in FIG. 3A. The light beam output by the gain equalizer 36b is photoelectrically converted at a photodiode (PD) 38b so that the photodiode 38b outputs a second multiplexed signal depending on the second wavelength-dependent quantization characteristic indicated by "Ib" in FIG. 3B. In the present embodiment, the gain equalizers 36a and 36b, including the photodiodes 38a and 38b, are configured so that the first multiplexed signal output by the photodiode 24a relies on the first wavelength-dependent quantization characteristic, and the second multiplexed signal output by the photodiode 24b relies on the second wavelength-dependent quantization characteristic.

In the wavelength-multiplex optical amplifier control apparatus of FIG. 4, a sampler 40a outputs a first signal indicative of a receiving power level Pa detected by the photodiode 38a, based on the first multiplexed signal, while a sampler 40b outputs a second signal indicative of a receiving power level Pb detected by the photodiode 38b, based on the second multiplexed signal. Generally, the receiving power level Pa and the receiving power level Pb are represented as in the above equation (1) and the above equation (2), respectively.

The sampler 40a supplies the receiving power level Pa (the current sample) to a power change calculating unit 42a, and the sampler 40b supplies the receiving power level Pb (the current sample) to a power change calculating unit 42b. In the power change calculating unit 42a, a power change (Pa–Pa') related to the photodiode 38a is computed based on the current sample Pa and the previous sample Pa' that was previously supplied by the sampler 40a. In the power change calculating unit 42b, a power change (Pb–Pb') related to the photodiode 38b is computed based on the current sample Pb and the previous sample Pb' that was previously supplied by the sampler 40b. The power change (Pa–Pa') is supplied from the power change calculating unit 42a to both the gain control unit 32 and a divider 44. The power change (Pb–Pb') is supplied from the power change calculating unit 42b to the divider 44.

The divider 44 calculates a power change ratio (Pa–Pa')/(Pb–Pb') based on the power change (Pa–Pa') supplied by the power change calculating unit 42a and the power change (Pb–Pb') supplied by the power change calculating unit 42b. The divider 44 outputs the resulting power change ratio (the current value) to a power-change-ratio observing unit 46. The power-change-ratio observing unit 46 determines whether the current value of the power change ratio (Pa–Pa')/(Pb–Pb') changes from a previous value of the power change ratio that was previously supplied by the divider 44.

As described above with reference to FIG. 2, when the power change ratio changes, the wavelength-multiplex optical amplifier control apparatus of FIG. 4 determines that, since the optical power of at least one channel in the multiplexed data has been partly turned off or has partly changed, the execution of the automatic level control (ALC) should be inhibited in order to avoid the occurrence of an error of the multiplexed data due to fluctuation of the optical signal power. On the other hand, when the power change ratio remains unchanged, all the optical powers of the channels in the multiplexed data have equally changed. The wavelength-multiplex optical amplifier control apparatus of FIG. 4 determines that the execution of the ALC should be allowed in order to maintain the output optical power at a constant level.

Specifically, in the embodiment of FIG. 4, the power-change-ratio observing unit 46 outputs a previous-level hold signal to the gain control unit 32 based on the difference between the current value of the power change ratio (Pa–Pa')/(Pb–Pb') and the previous value thereof. When the above difference is substantially equal to equation 0, the previous-level hold signal at the output of the power-change-ratio observing unit 46 is set to equation 0, which allows the gain control unit 32 to execute the ALC in order to maintain the output optical power at the constant level. In this case, the gain control unit 32 outputs a control signal to the optical amplifier 30 based on the power change (Pa–Pa') supplied by the power change calculating unit 42a. The optical amplifier 30 amplifies the input optical signal according to the control signal so as to make the power change (Pa–Pa') equal zero, and outputs the amplified optical signal.

On the other hand, when the above difference (the absolute value of the difference between the current value of the power change ratio (Pa–Pa')/(Pb–Pb') and the previous value thereof) is larger than a given reference value, the previous-level hold signal at the output of the power-change-ratio observing unit 46 is set to 1, which inhibits the execution of the ALC by the gain control unit 32. In the latter case, the gain control unit 32 outputs the previous control signal, to the optical amplifier 30, that was previously output based on the previous power change, and takes no account of the current power change (Pa–Pa') supplied by the power change calculating unit 42a.

In the present embodiment of the wavelength-multiplex optical amplifier control apparatus and method, when the power change ratio changes, it is determined that the optical power of at least one channel in the multiplexed data has been partly turned off or has partly changed. The execution of the automatic level control (ALC) by the gain control unit 32 is inhibited by the high-state hold signal output by the power-change-ratio observing unit 46. The wavelength-multiplex optical amplifier control apparatus and method of the present embodiment uses a simple, cost-effective circuit configuration and is effective in avoiding the occurrence of an error of the multiplexed data due to fluctuation of the optical signal power in such a case. The use of a spectrum analyzer and the transmission of the monitoring control signal are not required. When the power change ratio remains unchanged, it is determined that all the optical powers of the channels in the multiplexed data have equally changed. The execution of the ALC by the gain control unit 32 is allowed by the low-state hold signal output by the power-change-ratio observing unit 46. The wavelength-multiplex optical amplifier control apparatus and method of the present embodiment is effective in maintaining the output optical power at a constant level in such a case.

Figure 5:
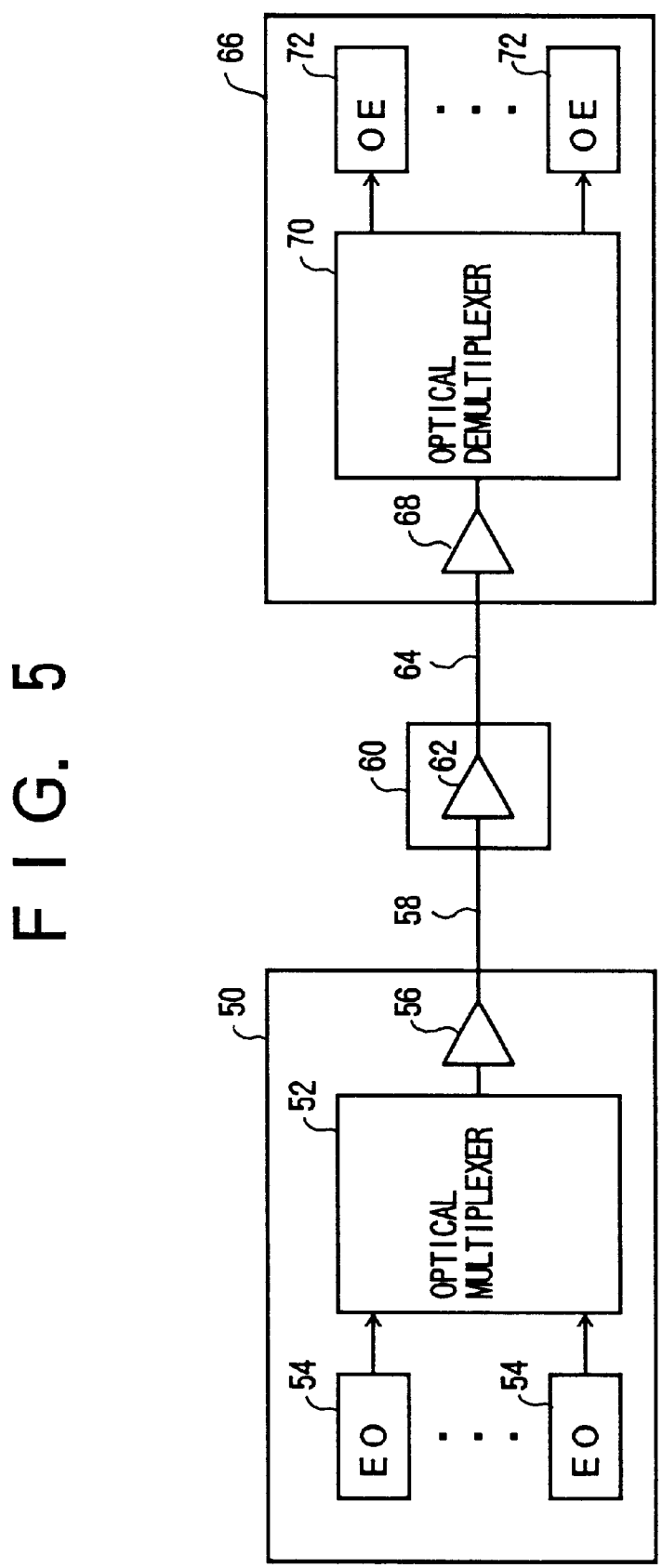
FIG. 5 is a block diagram of an optical transmission system to which one embodiment of the wavelength-multiplex optical amplifier control apparatus of the present invention is applied.

FIG. 5 shows an optical transmission system to which one embodiment of the wavelength-multiplex optical amplifier control apparatus of the present invention is applied.

In the optical transmission system of FIG. 5, an optical termination equipment 50 includes a plurality of electro-optical devices (EO) 54, an optical multiplexer 52, and an optical amplifier 56. The electro-optical devices 54 output a plurality of light beams carrying individual data of separate wavelengths, to the optical multiplexer 52. The optical multiplexer 52 combines data from the electro-optical devices 54 and outputs an optical signal carrying the wavelength-division multiplexed data to the optical amplifier 56. The optical amplifier 56 amplifies the input optical signal through the automatic level control (ALC), and supplies the amplified optical signal through an optical fiber 58 to an optical trunk 60.

In the optical transmission system of FIG. 5, the optical trunk 60 includes an optical amplifier 62. Similarly, the optical amplifier 62 amplifies the input optical signal through the ALC, and supplies the amplified optical signal through an optical fiber 64 to an optical termination equipment 66.

In the optical transmission system of FIG. 5, the optical termination equipment 66 includes an optical amplifier 68, an optical demultiplexer 70, and a plurality of opto-electrical devices (OE) 72. The optical amplifier 68 amplifies the input optical signal through the ALC, and supplies the amplified optical signal to the optical demultiplexer 70. The optical demultiplexer 70 separates the multiplexed data according to wavelength, and outputs the light beams carrying the individual data of separate wavelengths, to the opto-electrical devices 72. In each of the opto-electrical devices 72, the light beam is photoelectrically converted into an electrical signal indicating the individual data of the wavelength.

One embodiment of the wavelength-multiplex optical amplifier control apparatus of the present invention is applicable to any of the optical amplifiers 56, 62 and 68 in the optical transmission system of FIG. 5.

Figure 6:
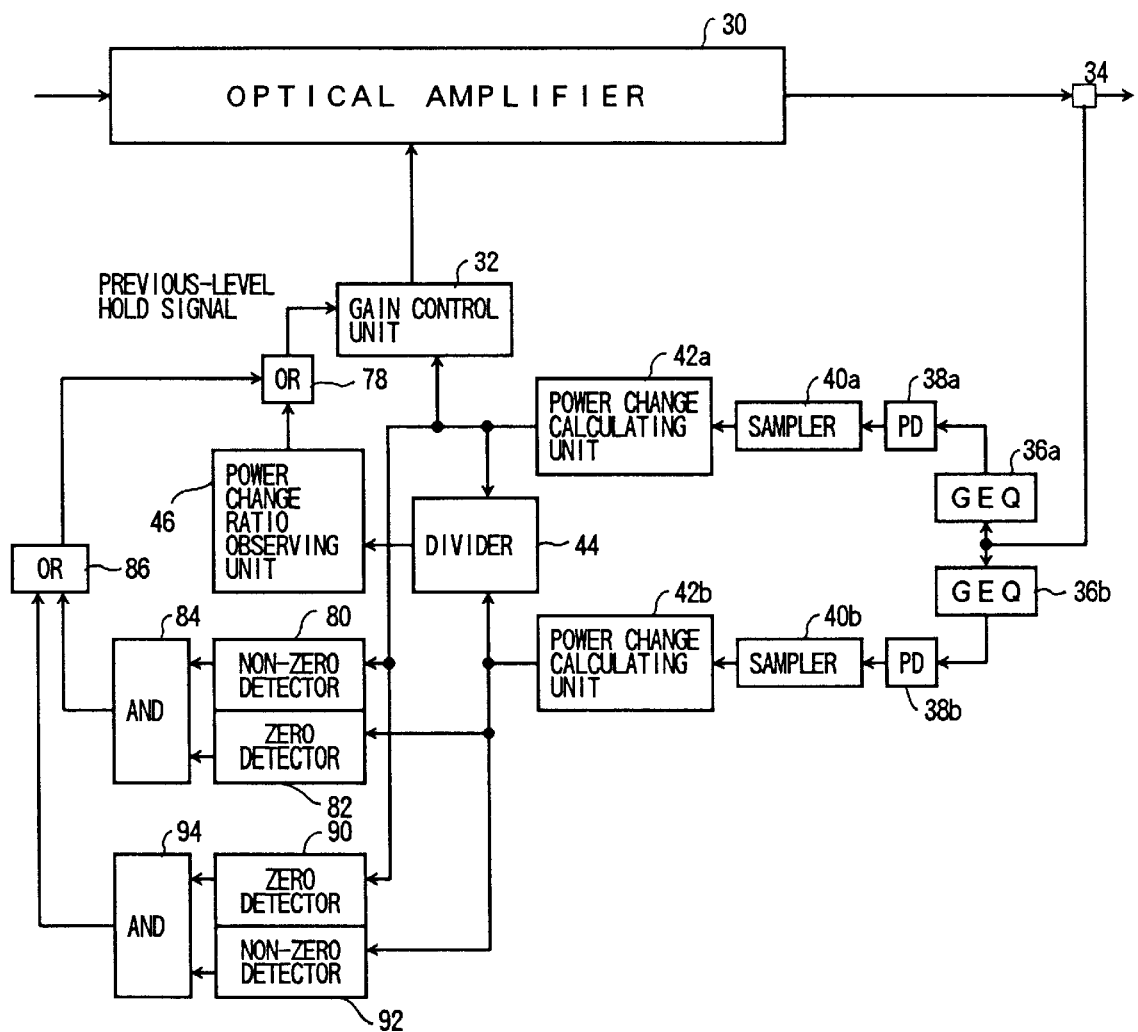
FIG. 6 is a block diagram of a second embodiment of the wavelength-multiplex optical amplifier control apparatus of the present invention.

FIG. 6 shows a second embodiment of the wavelength-multiplex optical amplifier control apparatus of the present invention. In FIG. 6, the elements which are essentially the same as corresponding elements in FIG. 4 are designated by the same reference numerals.

In the wavelength-multiplex optical amplifier control apparatus of FIG. 6, an input optical signal carrying the wavelength-division multiplexed data is supplied to the optical amplifier 30. The gain control unit 32 outputs a control signal to the optical amplifier 30 by executing the automatic level control (ALC). The optical amplifier 30 amplifies the input optical signal by varying the gain according to the control signal, and outputs the amplified optical signal to the optical splitter 34. The output optical power of the optical amplifier 30 is maintained at a constant level through the ALC.

In the wavelength-multiplex optical amplifier control apparatus of FIG. 6, the optical splitter 34 separates the optical signal, output by the optical amplifier 30, into two light beams, and delivers the light beams to the gain equalizer (GEQ) 36a and the gain equalizer (GEQ) 36b. The light beam output by the gain equalizer 36a is photoelectrically converted at the photodiode (PD) 38a so that the photodiode 38a outputs a first multiplexed signal depending on the first wavelength-dependent quantization characteristic indicated by "Ia" in FIG. 3A. The light beam output by the gain equalizer 36b is photoelectrically converted at the photodiode (PD) 38b so that the photodiode 38b outputs a second multiplexed signal depending on the second wavelength-dependent quantization characteristic indicated by "Ib" in FIG. 3B. The gain equalizers 36a and 36b, including the photodiodes 38a and 38b, are configured so that the first multiplexed signal output by the photodiode 24a relies on the first wavelength-dependent quantization characteristic Ia, and the second multiplexed signal output by the photodiode 24b relies on the second wavelength-dependent quantization characteristic Ib.

In the wavelength-multiplex optical amplifier control apparatus of FIG. 6, the sampler 40a outputs a first signal indicative of a receiving power level Pa detected by the photodiode 38a, based on the first multiplexed signal, while the sampler 40b outputs a second signal indicative of a receiving power level Pb detected by the photodiode 38b, based on the second multiplexed signal. Generally, the receiving power level Pa and the receiving power level Pb are represented as in the above equation (1) and the above equation (2), respectively.

The sampler 40a supplies the receiving power level Pa (the current sample) to the power change calculating unit 42a, and the sampler 40b supplies the receiving power level Pb (the current sample) to the power change calculating unit 42b. In the power change calculating unit 42a, a power change (Pa–Pa') related to the photodiode 38a is computed based on the current sample Pa and the previous sample Pa' that was previously supplied by the sampler 40a. In the power change calculating unit 42b, a power change (Pb–Pb') related to the photodiode 38b is computed based on the current sample Pb and the previous sample Pb' that was previously supplied by the sampler 40b. The power change (Pa–Pa') is supplied from the power change calculating unit 42a to the gain control unit 32 and the divider 44. The power change (Pb–Pb') is supplied from the power change calculating unit 42b to the divider 44.

The divider 44 calculates a power change ratio (Pa–Pa')/(Pb–Pb') based on the power change (Pa–Pa') supplied by the power change calculating unit 42a and the power change (Pb–Pb') supplied by the power change calculating unit 42b. The divider 44 outputs the resulting power change ratio (the current value) to the power-change-ratio observing unit 46. The power-change-ratio observing unit 46 determines whether the current value of the power change ratio (Pa–Pa')/(Pb–Pb') changes from the previous value of the power change ratio that was previously supplied by the divider 44.

In the embodiment of FIG. 6, the power-change-ratio observing unit 46 outputs a previous-level hold signal to the gain control unit 32 via an OR gate 78 based on the difference between the current value of the power change ratio (Pa–Pa')/(Pb–Pb') and the previous value thereof. When the above difference is substantially equal to equation 0 (or the power change ratio remains unchanged), the previous-level hold signal at the output of the power-change-ratio observing unit 46 is set to equation 0, which allows the gain control unit 32 to execute the ALC in order to maintain the output optical power at the constant level. In this case, the gain control unit 32 outputs a control signal to the optical amplifier 30 based on the power change (Pa–Pa') supplied by the power change calculating unit 42a. The optical amplifier 30 amplifies the input optical signal according to the control signal so as to make the power change (Pa–Pa') equal zero, and outputs the amplified optical signal.

On the other hand, when the above difference (the absolute value of the difference between the current value of the power change ratio (Pa–Pa')/(Pb–Pb') and the previous value thereof) is larger than a given reference value, the previous-level hold signal at the output of the power-change-ratio observing unit 46 is set to 1, which inhibits the execution of the ALC by the gain control unit 32. In the latter case, the gain control unit 32 outputs the previous control signal, to the optical amplifier 30, that was previously output based on the previous power change, and takes no account of the current power change (Pa–Pa') supplied by the power change calculating unit 42a.

In the embodiment of FIG. 6, a non-zero detector 80 and a zero detector 90 are connected to the output of the power change calculating unit 42a. When the power change (Pa–Pa') output by the power change calculating unit 42a is not equal to zero, the non-zero detector 80 outputs a high-state detection signal (set to the value 1) to an AND gate 84. When the power change (Pa–Pa') output by the power change calculating unit 42a is equal to zero, the zero detector 90 outputs a high-state detection signal (the value 1) to an AND gate 94. The output of the AND gate 84 and the output of the AND gate 94 are connected to an OR gate 86. The output of the OR gate 86 is connected to the input of the OR gate 78.

Further, in the embodiment of FIG. 6, a zero detector 82 and a non-zero detector 92 are connected to the output of the power change calculating unit 42b. When the power change (Pb–Pb') output by the power change calculating unit 42b is not equal to zero, the non-zero detector 92 outputs a high-state detection signal (the value 1) to the AND gate 94. When the power change (Pb–Pb') output by the power change calculating unit 42b is equal to zero, the zero detector 82 outputs a high-state detection signal (the value 1) to the AND gate 84. The AND gate 84 outputs a high-state signal (the value 1) to the OR gate 86 only when both the detection signals of the non-zero detector 80 and the zero detector 82 indicate the value 1. Otherwise the AND gate 84 outputs a low-state signal (the value 0) to the OR gate 86. Similarly, the AND gate 94 outputs a high-state signal (the value 1) to the OR gate 86 only when both the detection signals of the zero detector 90 and the non-zero detector 92 indicate the value 1. Otherwise the AND gate 94 outputs a low-state signal (the value 0) to the OR gate 86.

In the embodiment of FIG. 6, the OR gate 86 outputs a high-state signal (the value 1) to the OR gate 78 when one of the power change (Pa–Pa') or the power change (Pb–Pb') is equal toequation 0 and the other is unequal toequation 0. In this case, the high-state previous-level hold signal (the value 1) is supplied to the gain control unit 32 via the OR gate 78 even if either the power change (Pa–Pa') or the power change (Pb–Pb') is equal to zero. The execution of the ALC by the gain control unit 32 can be inhibited, and the previous control signal that was previously output based on the previous power change is supplied to the optical amplifier 30, taking no account of the current power change.

In the present embodiment of the wavelength-multiplex optical amplifier control apparatus and method, when the power change ratio changes and one of the power change (Pa–Pa') or the power change (Pb–Pb') is equal to zero, the execution of the automatic level control (ALC) by the gain control unit 32 is inhibited by the high-state hold signal output by the power-change-ratio observing unit 46. The wavelength-multiplex optical amplifier control apparatus and method of the present embodiment uses a simple, cost-effective circuit configuration and is effective in avoiding the occurrence of an error of the multiplexed data due to fluctuation of the optical signal power in such a case. The use of a spectrum analyzer and the transmission of the monitoring control signal are not required.

Figure 7:
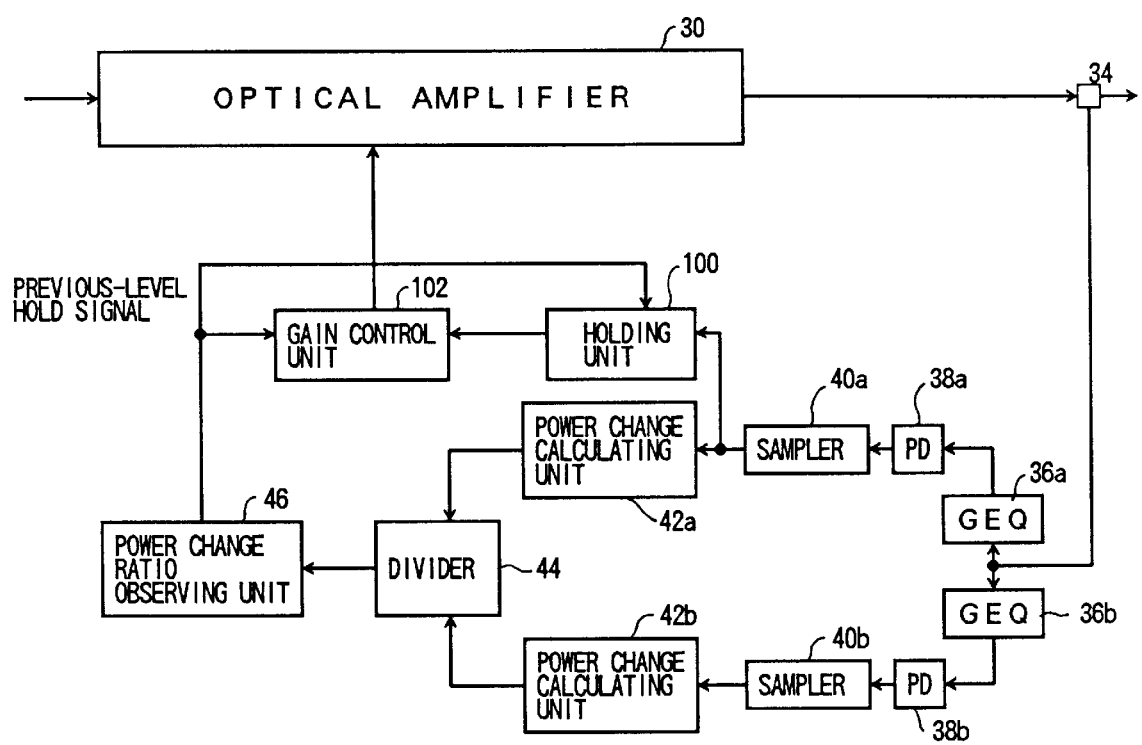
FIG. 7 is a block diagram of a third embodiment of the wavelength-multiplex optical amplifier control apparatus of the present invention.

FIG. 7 shows a third embodiment of the wavelength-multiplex optical amplifier control apparatus of the present invention. In FIG. 7, the elements which are essentially the same as corresponding elements in FIG. 4 are designated by the same reference numerals.

In the wavelength-multiplex optical amplifier control apparatus of FIG. 7, an input optical signal carrying the wavelength-division multiplexed data is supplied to the optical amplifier 30. A gain control unit 102 outputs a control signal to the optical amplifier 30 by executing the automatic level control (ALC). The optical amplifier 30 amplifies the input optical signal by varying the gain according to the control signal, and outputs the amplified optical signal to the optical splitter 34. The output optical power of the optical amplifier 30 is maintained at a constant level through the ALC.

In the wavelength-multiplex optical amplifier control apparatus of FIG. 7, the optical splitter 34 separates the optical signal, output by the optical amplifier 30, into two light beams, and delivers the light beams to the gain equalizer (GEQ) 36a and the gain equalizer (GEQ) 36b. The light beam output by the gain equalizer 36a is photoelectrically converted at the photodiode (PD) 38a so that the photodiode 38a outputs a first multiplexed signal depending on the first wavelength-dependent quantization characteristic indicated by "Ia" in FIG. 3A. The light beam output by the gain equalizer 36b is photoelectrically converted at the photodiode (PD) 38b so that the photodiode 38b outputs a second multiplexed signal depending on the second wavelength-dependent quantization characteristic indicated by "Ib" in FIG. 3B. The gain equalizers 36a and 36b, including the photodiodes 38a and 38b, are configured so that the first multiplexed signal output by the photodiode 24a relies on the first wavelength-dependent quantization characteristic Ia, and the second multiplexed signal output by the photodiode 24b relies on the second wavelength-dependent quantization characteristic Ib.

In the wavelength-multiplex optical amplifier control apparatus of FIG. 7, the sampler 40a outputs a first signal indicative of a receiving power level Pa detected by the photodiode 38a, based on the first multiplexed signal, while the sampler 40b outputs a second signal indicative of a receiving power level Pb detected by the photodiode 38b, based on the second multiplexed signal. The sampler 40a supplies the receiving power level Pa (the current sample) to the power change calculating unit 42a, and the sampler 40b supplies the receiving power level Pb (the current sample) to the power change calculating unit 42b. In the power change calculating unit 42a, a power change (Pa–Pa') related to the photodiode 38a is computed based on the current sample Pa and the previous sample Pa' that was previously supplied by the sampler 40a. In the power change calculating unit 42b, a power change (Pb–Pb') related to the photodiode 38b is computed based on the current sample Pb and the previous sample Pb' that was previously supplied by the sampler 40b. The power change (Pa–Pa') is supplied from the power change calculating unit 42a to the divider 44. The power change (Pb–Pb') is supplied from the power change calculating unit 42b to the divider 44.

The divider 44 calculates a power change ratio (Pa–Pa')/(Pb–Pb') based on the power change (Pa–Pa') supplied by the power change calculating unit 42a and the power change (Pb–Pb') supplied by the power change calculating unit 42b. The divider 44 outputs the resulting power change ratio (the current value) to the power-change-ratio observing unit 46. The power-change-ratio observing unit 46 determines whether the current value of the power change ratio (Pa–Pa')/(Pb–Pb') changes from the previous value of the power change ratio that was previously supplied by the divider 44.

In the embodiment of FIG. 7, a holding unit 100 is connected at its input to the output of the sampler 40a, and connected at its output to the input of the gain control unit 102. The power-change-ratio observing unit 46 produces a previous-level hold signal based on the difference between the current value of the power change ratio (Pa–Pa')/(Pb–Pb') and the previous value thereof, and outputs the previous-level hold signal to both the gain control unit 102 and the holding unit 100. When the above difference is substantially equal to 0 (or the power change ratio remains unchanged), the previous-level hold signal at the output of the power-change-ratio observing unit 46 is set to 0. When the above difference (the absolute value of the difference between the current value of the power change ratio (Pa–Pa')/(Pb–Pb') and the previous value thereof) is larger than a given reference value, the previous-level hold signal at the output of the power-change-ratio observing unit 46 is set to 1.

In the embodiment of FIG. 7, the holding unit 100 supplies the power level Pa (the current value), output by the sampler 40a, to the gain control unit 102 when the previous-level hold signal is set to 0. The gain control unit 102 execute the ALC in order to maintain the output optical power at the constant level. Synchronously with the sampling rate of the sampler 40a, the gain control unit 102 outputs a control signal to the optical amplifier 30 based on the power level Pa output from the holding unit 100. The optical amplifier 30 amplifies the input optical signal according to the control signal so as to make the sample Pa equal to a given target value, and outputs the amplified optical signal.

In the embodiment of FIG. 7, when the previous-level hold signal is set to 1, the holding unit 100 supplies the power level Pa' (the previous value), previously output by the sampler 40a and held at the holding unit 100, to the gain control unit 102. In this case, the execution of the ALC by the gain control unit 102 is inhibited. The gain control unit 102 outputs the previous control signal, to the optical amplifier 30, that was previously output based on the previous power level Pa'.

In the present embodiment of the wavelength-multiplex optical amplifier control apparatus and method, when the power change ratio changes, the execution of the automatic level control (ALC) by the gain control unit 102 is inhibited by the high-state hold signal output by the power-change-ratio observing unit 46. The wavelength-multiplex optical amplifier control apparatus and method of the present embodiment uses a simple, cost-effective circuit configuration and is effective in avoiding the occurrence of an error of the multiplexed data due to fluctuation of the optical signal power in such a case. The use of a spectrum analyzer and the transmission of the monitoring control signal are not required.

Figure 8:
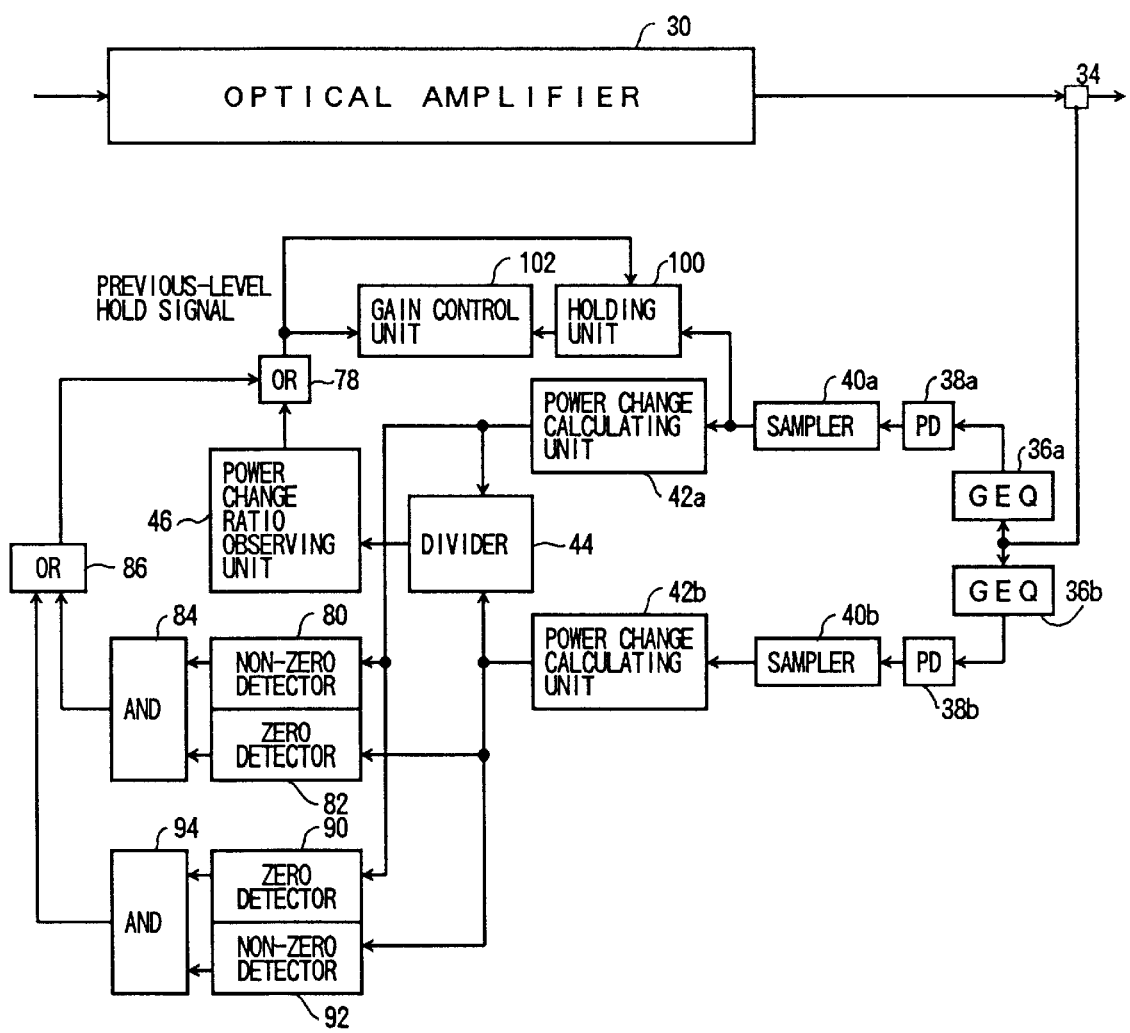
FIG. 8 is a block diagram of a fourth embodiment of the wavelength-multiplex optical amplifier control apparatus of the present invention.

FIG. 8 shows a fourth embodiment of the wavelength-multiplex optical amplifier control apparatus of the present invention. In FIG. 8, the elements which are essentially the same as corresponding elements in FIG. 6 or FIG. 7 are designated by the same reference numerals.

In the wavelength-multiplex optical amplifier control apparatus of FIG. 8, an input optical signal carrying the wavelength-division multiplexed data is supplied to the optical amplifier 30. The gain control unit 102 outputs a control signal to the optical amplifier 30 by executing the automatic level control (ALC). The optical amplifier 30 amplifies the input optical signal by varying the gain according to the control signal, and outputs the amplified optical signal to the optical splitter 34. The output optical power of the optical amplifier 30 is maintained at a constant level through the ALC.

In the wavelength-multiplex optical amplifier control apparatus of FIG. 8, the optical splitter 34 separates the optical signal, output by the optical amplifier 30, into two optical light beams, and delivers the light beams to the gain equalizer (GEQ) 36a and the gain equalizer (GEQ) 36b. The light beam output by the gain equalizer 36a is photoelectrically converted at the photodiode (PD) 38a so that the photodiode 38a outputs a first multiplexed signal depending on the first wavelength-dependent quantization characteristic indicated by "Ia" in FIG. 3A. The light beam output by the gain equalizer 36b is photoelectrically converted at the photodiode (PD) 38b so that the photodiode 38b outputs a second multiplexed signal depending on the second wavelength-dependent quantization characteristic indicated by "Ib" in FIG. 3B. The gain equalizers 36a and 36b, including the photodiodes 38a and 38b, are configured so that the first multiplexed signal output by the photodiode 24a relies on the first wavelength-dependent quantization characteristic Ia, and the second multiplexed signal output by the photodiode 24b relies on the second wavelength-dependent quantization characteristic Ib.

In the wavelength-multiplex optical amplifier control apparatus of FIG. 8, the sampler 40a outputs a first signal indicative of a receiving power level Pa detected by the photodiode 38a, based on the first multiplexed signal, while the sampler 40b outputs a second signal indicative of a receiving power level Pb detected by the photodiode 38b, based on the second multiplexed signal. The sampler 40a supplies the receiving power level Pa (the current sample) to the power change calculating unit 42a and to the holding unit 100, and the sampler 40b supplies the receiving power level Pb (the current sample) to the power change calculating unit 42b.

In the power change calculating unit 42a, a power change (Pa–Pa') related to the photodiode 38a is computed based on the current sample Pa and the previous sample Pa' that was previously supplied by the sampler 40a. In the power change calculating unit 42b, a power change (Pb–Pb') related to the photodiode 38b is computed based on the current sample Pb and the previous sample Pb' that was previously supplied by the sampler 40b. The power change (Pa–Pa') is supplied from the power change calculating unit 42a to the divider 44. The power change (Pb–Pb') is supplied from the power change calculating unit 42b to the divider 44.

The divider 44 calculates a power change ratio (Pa–Pa')/(Pb–Pb') based on the power change (Pa–Pa') supplied by the power change calculating unit 42a and the power change (Pb–Pb') supplied by the power change calculating unit 42b. The divider 44 outputs the resulting power change ratio (the current value) to the power-change-ratio observing unit 46. The power-change-ratio observing unit 46 determines whether the current value of the power change ratio (Pa–Pa')/(Pb–Pb') changes from the previous value of the power change ratio that was previously supplied by the divider 44.

In the embodiment of FIG. 8, the holding unit 100 is connected at its input to the output of the sampler 40a, and connected at its output to the input of the gain control unit 102. The power-change-ratio observing unit 46 produces a previous-level hold signal based on the difference between the current value of the power change ratio (Pa–Pa')/(Pb–Pb') and the previous value thereof, and outputs the previous-level hold signal to the gain control unit 102 via the OR gate 78, and to the holding unit 100 via the OR gate 78. When the above difference is substantially equal to 0 (or the power change ratio remains unchanged), the previous-level hold signal at the output of the power-change-ratio observing unit 46 is set to 0. When the above difference (the absolute value of the difference between the current value of the power change ratio (Pa–Pa')/(Pb–Pb') and the previous value thereof) is larger than a given reference value, the previous-level hold signal at the output of the power-change-ratio observing unit 46 is set to 1.

In the embodiment of FIG. 8, the holding unit 100 supplies the power level Pa (the current value), output by the sampler 40a, to the gain control unit 102 when the previous-level hold signal is set to 0. The gain control unit 102 executes the ALC in order to maintain the output optical power at the constant level. Synchronously with the sampling rate of the sampler 40a, the gain control unit 102 outputs a control signal to the optical amplifier 30 based on the power level Pa output from the holding unit 100. The optical amplifier 30 amplifies the input optical signal according to the control signal so as to make the sample Pa equal to a given target value, and outputs the amplified optical signal.

In the embodiment of FIG. 8, when the previous-level hold signal is set to 1, the holding unit 100 supplies the power level Pa' (the previous value), previously output by the sampler 40a and held at the holding unit 100, to the gain control unit 102. In this case, the execution of the ALC by the gain control unit 102 is inhibited. The gain control unit 102 outputs the previous control signal, to the optical amplifier 30, that was previously output based on the previous power level Pa'.

Further, in the embodiment of FIG. 8, the non-zero detector 80 and the zero detector 90 are connected to the output of the power change calculating unit 42a. When the power change (Pa–Pa') output by the power change calculating unit 42a is not equal to zero, the non-zero detector 80 outputs a high-state detection signal (set to the value 1) to the AND gate 84. When the power change (Pa–Pa') output by the power change calculating unit 42a is equal to zero, the zero detector 90 outputs a high-state detection signal (the value 1) to the AND gate 94. The output of the AND gate 84 and the output of the AND gate 94 are connected to the OR gate 86. The output of the OR gate 86 is connected to the input of the OR gate 78.

Further, in the embodiment of FIG. 8, the zero detector 82 and the non-zero detector 92 are connected to the output of the power change calculating unit 42b. When the power change (Pb–Pb') output by the power change calculating unit 42b is not equal to zero, the non-zero detector 92 outputs a high-state detection signal (the value 1) to the AND gate 94. When the power change (Pb–Pb') output by the power change calculating unit 42b is equal to zero, the zero detector 82 outputs a high-state detection signal (the value 1) to the AND gate 84. The AND gate 84 outputs a high-state signal (the value 1) to the OR gate 86 only when both the detection signals of the non-zero detector 80 and the zero detector 82 indicate the value 1. Otherwise the AND gate 84 outputs a low-state signal (the value 0) to the OR gate 86. Similarly, the AND gate 94 outputs a high-state signal (the value 1) to the OR gate 86 only when both the detection signals of the zero detector 90 and the non-zero detector 92 indicate the value 1. Otherwise the AND gate 94 outputs a low-state signal (the value 0) to the OR gate 86.

In the embodiment of FIG. 8, the OR gate 86 outputs a high-state signal (the value 1) to the OR gate 78 when one of the power change (Pa–Pa') or the power change (Pb–Pb') is equal to 0 and the other is unequal to 0. In this case, the high-state previous-level hold signal (the value 1) is supplied to the gain control unit 32 via the OR gate 78 even if either the power change (Pa–Pa') or the power change (Pb–Pb') is equal to zero. The execution of the ALC by the gain control unit 32 can be inhibited, and the previous control signal that was previously output based on the previous power change is supplied to the optical amplifier 30, taking no account of the current power change.

In the present embodiment of the wavelength-multiplex optical amplifier control apparatus and method, when the power change ratio changes and one of the power change (Pa–Pa') or the power change (Pb–Pb') is equal to zero, the execution of the automatic level control (ALC) by the gain control unit 102 is inhibited by the high-state hold signal output by the power-change-ratio observing unit 46. The wavelength-multiplex optical amplifier control apparatus and method of the present embodiment uses a simple, cost-effective circuit configuration and is effective in avoiding the occurrence of an error of the multiplexed data due to fluctuation of the optical signal power in such a case. The use of a spectrum analyzer and the transmission of the monitoring control signal are not required.

Next, a description will be given of another aspect of the wavelength-multiplex optical amplifier control of the present invention. By selecting appropriate quantization characteristics ηa and ηb of the gain equalizers 22a and 22b including the photodiodes 38a and 38b in the wavelength-multiplex optical amplifier control apparatus, it is possible to satisfy the following formulas:

$$\sum_{i=1}^{n} \eta a(\lambda i) = \sum_{i=1}^{n} \eta b(\lambda i)$$

$$\eta a(\lambda k) \neq \eta b(\lambda k) \text{ (where } 1 \leq k \leq n\text{)}$$

The receiving power levels Pa and Pb, detected at the photodiodes 38a and 38b before the optical power of one wavelength λX in the multiplexed data is partly turned off, and the receiving power levels Pa' and Pb', detected at the photodiodes 38a and 38b after the optical power of the wavelength λX in the multiplexed data is partly turned off, are represented by the following equations:

$$Pa = \sum_{i=1}^{n} \eta a(\lambda i) P$$

$$Pa' = \sum_{i=1}^{n} \eta a(\lambda i) P - \eta a(\lambda x) P$$

$$Pb = \sum_{i=1}^{n} \eta b(\lambda i) P$$

$$Pb' = \sum_{i=1}^{n} \eta b(\lambda i) P - \eta b(\lambda x) P$$

As described above, the condition $$\eta a(\lambda k) \neq \eta b(\lambda k)$$

is satisfied. According to the above aspect of the invention, when the optical power of one wavelength in the multiplexed data is partly turned off, the power level Pa' detected at the photodiode 38a is not equal to the power level Pb' detected at the photodiode 38b.

On the other hand, when all the optical powers of the individual channels in the multiplexed data equally change from P to P', the receiving power level Pa' detected at the photodiode 38a and the receiving power level Pb' detected at the photodiode 38b, in such a case, are represented by the following equations:

$$Pa' = \sum_{i=1}^{n} \eta a(\lambda i) P'$$

$$Pb' = \sum_{i=1}^{n} \eta b(\lambda i) P'$$

As in the above-described formulas, the condition Pa'=Pb' is satisfied. According to the above-mentioned aspect of the present invention, when all the optical powers of the individual channels in the multiplexed data equally change, the power level Pa' detected at the photodiode 38a is equal to the power level Pb' detected at the photodiode 38b.

The wavelength-multiplex optical amplifier control of the present invention according to the above-mentioned aspect makes use of the first and second multiplexed signals output by the photodiodes 38a and 38b, to determine whether or not the power level Pa is equal to the power level Pb. In this case, it is necessary to compare a compensated power level K·Pa that is produced by multiplying the power level Pa by a proper conversion factor K, with the power level Pb, in order to ensure the effectiveness of this aspect even when the number of the channels (the wavelengths) contained in the multiplexed data varies. When the K·Pa is not equal to the Pb, it is determined that, since the optical power of at least one channel in the multiplexed data has been partly turned off or has partly changed, the execution of the automatic level control (ALC) should be inhibited in order to avoid the occurrence of an error of the multiplexed data due to fluctuation of the optical signal power. On the other hand, when K·Pa=Pb, it is determined that the execution of the automatic level control should be allowed in order to maintain the output optical power at a constant level. A preferred embodiment of the wavelength-multiplex optical amplifier control apparatus of the present invention which utilizes the above aspect will now be described with reference to FIG. 9.

Figure 9:
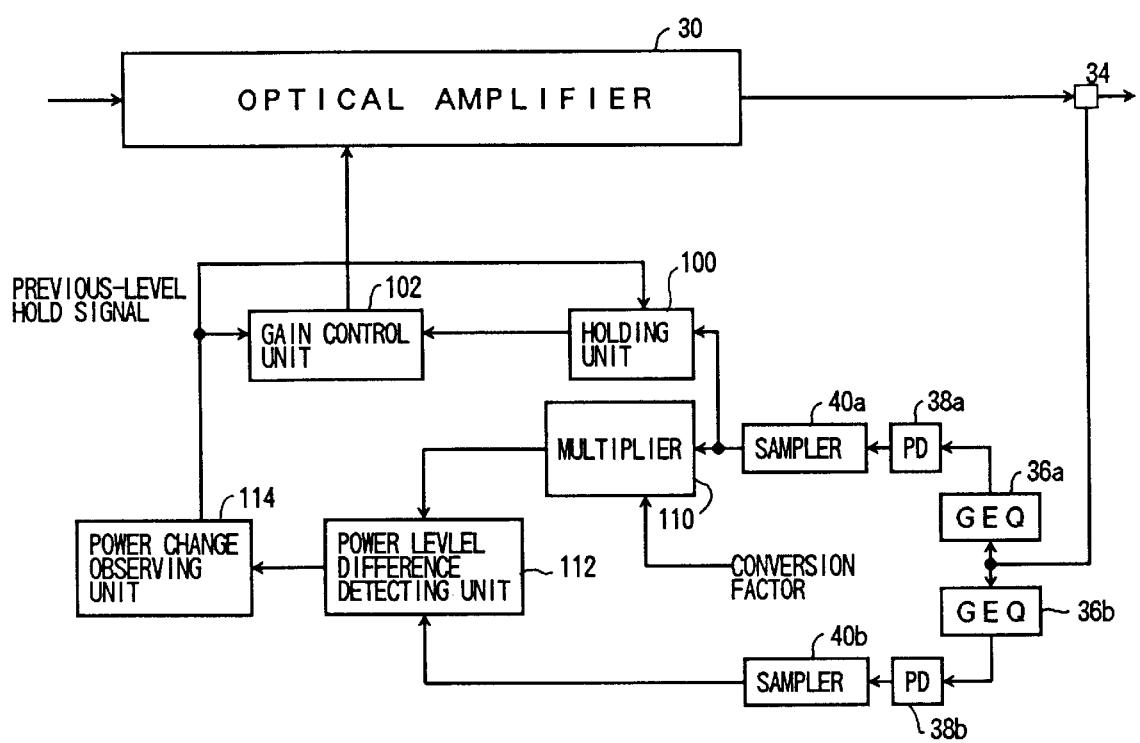
FIG. 9 is a block diagram of a fifth embodiment of the wavelength-multiplex optical amplifier control apparatus of the present invention.

FIG. 9 shows a fifth embodiment of the wavelength-multiplex optical amplifier control apparatus of the present invention. In FIG. 9, the elements which are essentially the same as corresponding elements in FIG. 7 are designated by the same reference numerals.

In the wavelength-multiplex optical amplifier control apparatus of FIG. 9, an input optical signal carrying the wavelength-division multiplexed data is supplied to the optical amplifier 30. The gain control unit 102 outputs a control signal to the optical amplifier 30 by executing the automatic level control (ALC). The optical amplifier 30 amplifies the input optical signal by varying the gain according to the control signal, and outputs the amplified optical signal to the optical splitter 34. The output optical power of the optical amplifier 30 is maintained at a constant level through the ALC.

In the wavelength-multiplex optical amplifier control apparatus of FIG. 9, the optical splitter 34 separates the optical signal, output by the optical amplifier 30, into two light beams, and delivers the light beams to the gain equalizer (GEQ) 36a and the gain equalizer (GEQ) 36b. The light beam output by the gain equalizer 36a is photoelectrically converted at the photodiode (PD) 38a so that the photodiode 38a outputs a first multiplexed signal depending on the first wavelength-dependent quantization characteristic indicated by "Ia" in FIG. 3A. The light beam output by the gain equalizer 36b is photoelectrically converted at the photodiode (PD) 38b so that the photodiode 38b outputs a second multiplexed signal depending on the second wavelength-dependent quantization characteristic indicated by "Ib" in FIG. 3B.

In the wavelength-multiplex optical amplifier control apparatus of FIG. 9, the sampler 40a outputs a first signal indicative of a receiving power level Pa detected by the photodiode 38a, based on the first multiplexed signal, while the sampler 40b outputs a second signal indicative of a receiving power level Pb detected by the photodiode 38b, based on the second multiplexed signal. The sampler 40a supplies the receiving power level Pa (the current sample) to the holding unit 100 and to a multiplier 110, and the sampler 40b supplies the receiving power level Pb (the current sample) to a power level difference detecting unit 112. In the multiplier 110, a proper conversion factor K that is selected so as to ensure the equality of the power levels detected at the photodiodes 38a and 38b regardless of the number of the channels (the wavelengths) in the multiplexed data, is externally supplied to another input of the multiplier 110. The multiplier 110 supplies the product K·Pa of the power level Pa and the conversion factor K to the power level difference detecting unit 112.

The power level difference detecting unit 112 calculates a power level difference (K·Pa−Pb) indicative of a difference between the power level Pa multiplied by the conversion factor K and the second power level Pb, and outputs the power level difference (K·Pa−Pb) to the power change observing unit 114. The power change observing unit 114 determines whether the optical power of at least one channel in the multiplexed data is partly turned off or partly changes, based on the power level difference (K·Pa−Pb). That is, when the power level difference is larger than a given reference value, it is determined that the optical power of at least one channel in the multiplexed data is partly turned off or partly changes. When the power level difference is substantially equal to 0, it is determined that all the optical powers of the individual channels in the multiplexed data equally change. The power change observing unit 114 supplies a previous-level hold signal which is produced depending on the result of the determination, to the gain control unit 102 and to the holding unit 100.

In the embodiment of FIG. 9, the holding unit 100 is connected at its input to the output of the sampler 40a, and connected at its output to the input of the gain control unit 102. When the power level difference (K·Pa−Pb) is substantially equal to 0, the previous-level hold signal at the output of the power change observing unit 114 is set to 0. When the power level difference (K·Pa−Pb) (or the absolute value of the difference) is larger than the reference value, the previous-level hold signal at the output of the power change observing unit 114 is set to 1.

In the embodiment of FIG. 9, the holding unit 100 supplies the power level Pa (the current value), output by the sampler 40a, to the gain control unit 102 when the previous-level hold signal is set to 0. The gain control unit 102 executes the ALC in order to maintain the output optical power at the constant level. Synchronously with the sampling rate of the sampler 40a, the gain control unit 102 outputs a control signal to the optical amplifier 30 based on the power level Pa output from the holding unit 100. The optical amplifier 30 amplifies the input optical signal according to the control signal so as to make the sample Pa equal to a given target value, and outputs the amplified optical signal.

In the embodiment of FIG. 9, when the previous-level hold signal is set to 1, the holding unit 100 supplies the power level Pa' (the previous value), previously output by the sampler 40a and held at the holding unit 100, to the gain control unit 102. In this case, the execution of the ALC by the gain control unit 102 is inhibited. The gain control unit 102 outputs the previous control signal, to the optical amplifier 30, that was previously output based on the previous power level Pa'.

In the present embodiment of the wavelength-multiplex optical amplifier control apparatus and method of the present invention, when the power level difference is larger than the reference value, the execution of the automatic level control (ALC) by the gain control unit 102 is inhibited by the high-state hold signal output by the power change observing unit 114. The wavelength-multiplex optical amplifier control apparatus and method of the present embodiment uses a simple, cost-effective circuit configuration and is effective in avoiding the occurrence of an error of the multiplexed data due to fluctuation of the optical signal power in such a case. The use of a spectrum analyzer and the transmission of the monitoring control signal are not required.

Figure 10:
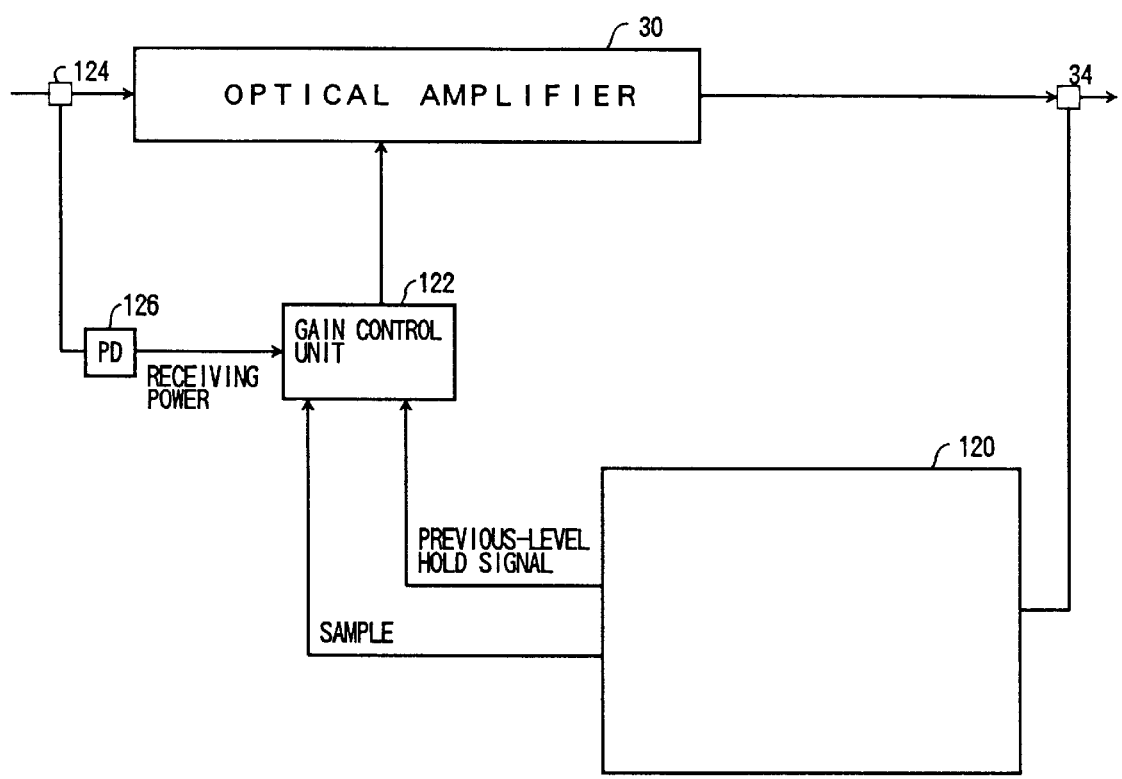
FIG. 10 is a block diagram of a sixth embodiment of the wavelength-multiplex optical amplifier control apparatus of the present invention.

FIG. 10 shows a sixth embodiment of the wavelength-multiplex optical amplifier control apparatus of the present invention.

Generally, when the optical power of one channel in the multiplexed data is turned off (for example, when the four-wavelength multiplexed data is turned into the three-wavelength multiplexed data), the gain control by the gain control unit is changed from the automatic level control (ALC) into a fixed gain control. The fixed gain control must continue to run until the channel in the multiplexed data is recovered to the on-state. However, if the execution of the fixed gain control is considerably long, the loss of the optical power over the transmission lines becomes too large to be absorbed at the optical amplifier. To avoid this, it is necessary to restart the execution of the ALC at the gain control unit when a permissible continuation period is exceeded by a time period of the execution of the fixed gain control. In the present embodiment, the gain control unit sets a target value of the ALC to an optical power of the input optical signal when the permissible continuation period is exceeded by the time period of the execution of the fixed gain control, and restarts the execution of the ALC at an end of the continuation period by using the target value.

Suppose that the input optical signal received at the optical splitter 34 contains the four signal elements for the first through fourth wavelengths. The following equations are satisfied:

$$Pa = \eta a(\lambda 1)P + \eta a(\lambda 2)P + \eta a(\lambda 3)P + \eta a(\lambda 4)P = \sum_{i=1}^{n} \eta a(\lambda i)P$$

$$Pb = \eta b(\lambda 1)P + \eta b(\lambda 2)P + \eta b(\lambda 3)P + \eta b(\lambda 4)P =$$

$$\sum_{i=1}^{n} \eta b(\lambda i)P \sum_{i=1}^{n} \eta a(\lambda i) = k \sum_{i=1}^{n} \eta b(\lambda i)$$

When all the optical powers of the four wavelengths in the multiplexed data equally change from P to P' and only the optical power of the first wavelength changes from P' to (P'+δp), $$Pa' = \eta a(\lambda 1)(P' + \delta p) + \eta a(\lambda 2)P' + \eta a(\lambda 3)P' + \eta a(\lambda 4)P'$$

$$= \sum_{i=1}^{n} \eta a(\lambda i)P' + \eta a(\lambda 1)\delta p$$

$$Pb' = \eta b(\lambda 1)(P' + \delta p) + \eta b(\lambda 2)P' + \eta b(\lambda 3)P' + \eta b(\lambda 4)P'$$

$$= \sum_{i=1}^{n} \eta b(\lambda i)P' + \eta b(\lambda 1)\delta p$$

In the above case, the power level difference (Pa–Pb) changes, and the power change observing unit 114 in the embodiment of FIG. 9 outputs the high-state hold signal to the gain control unit 102. The gain control by the gain control unit 102 is changed from the automatic level control (ALC) into the fixed gain control. The optical powers of the three wavelengths change by $[\eta a(\lambda 1) - \eta b(\lambda 1)]\delta p$ as apparent from the above equations. The gain control unit in the present embodiment sets a target value of the ALC to the optical power of the input optical signal when the permissible continuation period is exceeded by the time period of the execution of the fixed gain control, and restarts the execution of the ALC at the end of the continuation period by using the target value, so as to maintain the output optical power at a constant level and cancel the change of the optical powers of the three wavelengths. The condition $\eta a(\lambda i) \neq \eta b(\lambda i)$ must be satisfied.

In the wavelength-multiplex optical amplifier control apparatus of FIG. 10, a detection block 120 corresponds to the elements of the apparatus of FIG. 7, FIG. 8 or FIG. 9 with the elements 30, 34 and 102 excluded. The detection block 120 supplies the previous-level hold signal and the sample Pa to a gain control unit 122. An optical splitter 124 is provided at the input of the optical amplifier 30. The optical splitter 124 separates the input optical signal into two light beams, and delivers the light beams to the optical amplifier 30 and a photodiode (PD) 126. The light beam is photoelectrically converted at the photodiode 126 so that the photodiode 126 outputs a multiplexed signal, indicative of the receiving optical power of the input optical signal, to the gain control unit 122.

In the wavelength-multiplex optical amplifier control apparatus of FIG. 10, the gain control unit 122 sets a target value of the ALC to the receiving optical power of the input optical signal when the permissible continuation period is exceeded by the time period of the execution of the fixed gain control, and restarts the execution of the ALC at the end of the continuation period by using the target value and the sample Pa. After the restart, the gain control unit 122 outputs a control signal to the optical amplifier 30 based on the target value and the sample Pa by executing the ALC.

In the above-described embodiments, it has been assumed that the signal elements for the individual wavelengths contained in the optical signal received at the optical amplifier have equal receiving power. Hereinafter, this case will be referred to as the uniform case. However, a non-uniform case in which the optical powers of the individual channels in the multiplexed data received at the optical amplifier are not equal one another may arise due to the loss of the optical power over the transmission lines. A description will now be given of the wavelength-multiplex optical amplifier control of the present invention which deals with the non-uniform case.

$$Pa = \eta a(\lambda 1)(P + \delta p) + \eta a(\lambda 2)P + \eta a(\lambda 3)P + \eta a(\lambda 4)P$$

$$= \sum_{i=1}^{n} \eta a(\lambda i)P + \eta a(\lambda 1)\delta p$$

$$Pb = \eta b(\lambda 1)(P + \delta p) + \eta b(\lambda 2)P + \eta b(\lambda 3)P + \eta b(\lambda 4)P$$

$$= \sum_{i=1}^{n} \eta b(\lambda i)P + \eta b(\lambda 1)\delta p$$

When all the optical powers of the individual wavelengths in the multiplexed data equally change from P to P', only the optical power of the first wavelength increases by (P+δP)/P. Supposing that P'=P+d, a change in the optical power of the first wavelength is d (1+P)/P.

$$Pa' = \eta a(\lambda 1)[P' + \delta p(1 + d/P)] + \eta a(\lambda 2)P' + \eta a(\lambda 3)P' + \eta a(\lambda 4)P'$$
$$= \sum_{i=1}^{n} \eta a(\lambda i)P' + \eta a(\lambda 1)\delta p(1 + d/P)$$

$$Pb' = \eta b(\lambda 1)[P' + \delta p(1 + d/P)] + \eta b(\lambda 2)P' + \eta b(\lambda 3)P' + \eta b(\lambda 4)P'$$
$$= \sum_{i=1}^{n} \eta b(\lambda i)P' + \eta b(\lambda 1)\delta p(1 + d/P)$$

$$Pa - Pa' = \sum_{i=1}^{n} \eta a(\lambda i)(P - P') - \eta a(\lambda 1)\delta pd/P$$
$$= \sum_{i=1}^{n} \eta a(\lambda i)d - \eta a(\lambda 1)\delta pd/P$$

$$Pb - Pb' = \sum_{i=1}^{n} \eta b(\lambda i)(P - P') - \eta b(\lambda 1)\delta pd/P$$
$$= \sum_{i=1}^{n} \eta b(\lambda i)d - \eta b(\lambda 1)\delta pd/P$$

From the above equations, it can be detected whether the optical powers of the individual channels in the multiplexed data received at the optical amplifier are not equal one another, based on the power change ratio (Pa–Pa')/(Pb–Pb'). In a case in which the wavelength-multiplex optical amplifier control apparatus is configured to meet the condition $\Sigma \eta a(\lambda i) = \Sigma \eta b(\lambda i)$, it can be detected whether the optical powers of the individual channels in the multiplexed data received at the optical amplifier are not equal one another, based on the power level difference (Pa–Pb).

The above-described detection of the non-uniform case is executed by the gain control unit (one of the gain control units 32, 102 and 122) in the wavelength-multiplex optical amplifier control apparatus of the present invention. The gain control unit outputs an alarm signal when the optical powers of the individual channels in the multiplexed data received at the optical amplifier are not equal one another. In the non-uniform case, the power change detection according to the present invention is not useful for detecting whether the optical power of at least one channel in the multiplexed data is partly turned off or partly changes.

FIG. 11 shows a portion of the wavelength-multiplex optical amplifier control apparatus which detects the optical power of one channel in the multiplexed data. In the portion of the control apparatus of FIG. 11, a single photodiode is utilized to determine the respective optical power of the individual channels in the multiplexed data by varying a wavelength-dependent quantization characteristic.

As shown in FIG. 11, the portion of the wavelength-multiplex optical amplifier control apparatus includes a variable tilt generator 130, a photodiode (PD) 132 and a control circuit 134. An optical signal (a light beam) carrying the wavelength-division multiplexed data, output by an optical amplifier (not shown), is supplied through the variable tilt generator 130 to the photodiode 132. The light beam is photoelectrically converted at the photodiode 132 so that the photodiode 132 outputs a multiplexed signal (the detection value) depending on a wavelength-dependent quantization characteristic of the variable tilt generator 130. The control circuit 134 outputs a tilt-amount setting signal to the variable tilt generator 130 so as to vary the wavelength-dependent quantization characteristic of the variable tilt generator 130 depending on the tilt amount of the setting signal. The control circuit 134 determines the respective optical powers of the individual channels in the multiplexed data from the resulting detection values and quantization characteristics based on the following equations:

P(Xa)=η(Xa, λ1)P1+η(Xa, λ2)P2+η(Xa, λ3)P3+η(Xa, λ4)P4

P(Xb)=η(Xb, λ1)P1+η(Xb, λ2)P2+η(Xb, λ3)P3+η(Xb, λ4)P4

P(Xc)=η(Xc, λ1)P1+η(Xc, λ2)P2+η(Xc, λ3)P3+η(Xc, λ4)P4

P(Xd)=η(Xd, λ1)P1+η(Xd, λ2)P2+η(Xd, λ3)P3+η(Xd, λ4)P4

In the above equations, the four-wavelength multiplexed data is assumed, P1, P2, P3 and P4 indicate the respective optical powers of the individual wavelengths in the multiplexed data, Xa, Xb, Xc and Xd denote the tilt amounts of the variable tilt generator 130, and P(Xa), P(Xb), P(Xc) and P(Xd) denote the detection values obtained by the photodiode 132.

In the above-described embodiments: the gain equalizers 36a and 36b including the photodiodes 38a and 38b correspond to the first and second photodetecting units in the claims; the power change calculating units 42a and 42b and the divider 44, or the multiplier 110 and the power level difference detecting unit 112 correspond to the power change detecting unit in the claims; the power change ratio observing unit 46, the elements 78, 80, 82, 86, 90, 92 and 94, or the power change observing unit 114 correspond to the observing unit in the claims; and the gain control unit 32, the gain control unit 102, or the gain control unit 122 and the photodiode 126 correspond to the gain control unit in the claims.

The present invention is not limited to the above-described embodiments, and variations and modifications may be made without departing from the scope of the present invention.

Further, the present invention is based on Japanese priority application No. 11-039,103, filed on Feb. 17, 1999, the entire contents of which are hereby incorporated by reference.

What is claimed is:

1. A wavelength-multiplex optical amplifier control apparatus in which an automatic level control is executed on an optical amplifier to maintain an output optical power of the amplifier at a constant level, comprising:

first and second photodetecting units, having different quantization characteristics, which respectively detect first and second power levels from an input optical signal carrying wavelength-division multiplexed data;

a power change detecting unit which detects whether an optical power of at least one channel in the multiplexed data is partly turned off or partly changes, based on the first and second power levels detected by the first and second photodetecting units; and an observing unit which inhibits the execution of the automatic level control when the power change detecting unit detects that the optical power of at least one channel in the multiplexed data is partly turned off or partly changes.

2. The apparatus according to claim 1, wherein the power change detecting unit calculates a power change ratio indicative of the ratio of a change in the first power level detected by the first photodetecting unit to a change in the second power level detected by the second photodetecting unit, the power change detecting unit detecting whether the optical power of at least one channel in the multiplexed data is partly turned off or partly changes, based on the power change ratio.

3. The apparatus according to claim 2, wherein the power change detecting unit includes a zero/non-zero detection unit which detects whether either the change in the first power level or the change in the second power level is equal to zero.

4. The apparatus according to claim 2, further comprising a gain control unit which outputs a control signal to the optical amplifier based on one of the change in the first power level detected by the first photodetecting unit or the change in the second power level detected by the second photodetecting unit.

5. The apparatus according to claim 2, further comprising a gain control unit which outputs a control signal to the optical amplifier based on one of the first power level detected by the first photodetecting unit or the second power level detected by the second photodetecting unit.

6. The apparatus according to claim 1, wherein the power change detecting unit calculates a power level difference indicative of a difference between the first power level multiplied by a conversion factor and the second power level, the power change detecting unit detecting whether the optical power of at least one channel in the multiplexed data is partly turned off or partly changes, based on the power level difference.

7. The apparatus according to claim 6, further comprising a gain control unit which sets a target value of the automatic level control to an optical power of the input optical signal when a permissible continuation period is exceeded by a time period during which the power change detecting unit continuously detects that the optical power of at least one channel in the multiplexed data is partly turned off, the gain control unit restarting the execution of the automatic level control at an end of the continuation period by using the target value.

8. The apparatus according to claim 1, further comprising a gain control unit which outputs an alarm signal when optical powers of individual channels in the multiplexed data received at the optical amplifier are not equal one another.

9. A wavelength-multiplex optical amplifier control method which executes an automatic level control on an optical amplifier to maintain an output optical power of the amplifier at a constant level, comprising:

photoelectrically detecting a first power level and a second power level from an input optical signal carrying wavelength-division multiplexed data, by using first and second photo detecting units having different quantization characteristics;

detecting whether an optical power of at least one channel in the multiplexed data is partly turned off or partly changes, based on the detected first and second power levels; and inhibiting the execution of the automatic level control when it is detected that the optical power of at least one channel in the multiplexed data is partly turned off or partly changes.

10. The method according to claim 9, wherein said second detecting step includes a step of calculating a power change ratio indicative of the ratio of a change in the first power level to a change in the second power level, said second detecting step detecting whether the optical power of at least one channel in the multiplexed data is partly turned off or partly changes, based on the power change ratio.

11. The method according to claim 10, wherein said second detecting step includes a step of detecting whether either the change in the first power level or the change in the second power level is equal to zero.

12. The method according to claim 10, further comprising a step of outputting a control signal to the optical amplifier based on one of the change in the first power level or the change in the second power level.

13. The method according to claim 10, further comprising a step of outputting a control signal to the optical amplifier based on one of the first power level or the second power level.

14. The method according to claim 9, wherein said second detecting step includes a step of calculating a power level difference indicative of a difference between the first power level multiplied by a conversion factor and the second power level, said second detecting step detecting whether the optical power of at least one channel in the multiplexed data is partly turned off or partly changes, based on the power level difference.

15. The method according to claim 14, further comprising a step of setting a target value of the automatic level control to an optical power of the input optical signal when a permissible continuation period is exceeded by a time period during which it is continuously detected that the optical power of at least one channel in the multiplexed data is partly turned off, so that the execution of the automatic level control is restarted at an end of the continuation period by using the target value.

16. The method according to claim 9, further comprising a step of outputting an alarm signal when optical powers of individual channels in the multiplexed data received at the optical amplifier are not equal one another.

* * * * *